United States Patent [19]
Ohiwa

[11] Patent Number: 5,181,986
[45] Date of Patent: Jan. 26, 1993

[54] PLASMA PROCESSING APPARATUS

[75] Inventor: Kiyoshi Ohiwa, Tokyo, Japan

[73] Assignee: Fuji Electric Co., Ltd., Kawasaki, Japan

[21] Appl. No.: 677,238

[22] Filed: Mar. 19, 1991

[30] Foreign Application Priority Data

Apr. 2, 1990 [JP] Japan .................................. 2-87887

[51] Int. Cl.$^5$ ........................................... H01L 21/00
[52] U.S. Cl. .................... 156/643; 156/345; 118/723; 427/575; 204/298.16
[58] Field of Search ............... 156/345, 643; 118/723; 204/298.02, 298.16, 298.06, 298.31, 298.34, 298.37; 427/39

[56] References Cited

U.S. PATENT DOCUMENTS

| | | | |
|---|---|---|---|
| 4,298,419 | 11/1981 | Suzuki et al. | 156/646 |
| 4,721,553 | 1/1988 | Saito et al. | 204/192.19 |
| 4,776,918 | 10/1988 | Otsubo et al. | 156/643 |
| 4,876,983 | 10/1989 | Fukuda et al. | 204/298.16 |
| 4,891,118 | 1/1990 | Ooiwa et al. | 156/345 |
| 4,983,253 | 1/1991 | Wolfe et al. | 156/345 |
| 4,990,229 | 2/1991 | Campbell et al. | 204/298.16 |

FOREIGN PATENT DOCUMENTS

| | | |
|---|---|---|
| 56-37311 | 8/1981 | Japan . |
| 63-043324 | 2/1988 | Japan . |
| 63-43324 | 2/1988 | Japan . |
| 64-004023 | 1/1989 | Japan . |
| 1-236629 | 9/1989 | Japan . |
| 2-009787 | 1/1990 | Japan . |

Primary Examiner—Brian E. Hearn
Assistant Examiner—George Goudreau
Attorney, Agent, or Firm—Spencer, Frank & Schneider

[57] ABSTRACT

In a plasma processing device a plasma generation chamber communicates with a processing chamber holding a substrate. A first solenoid is disposed around the generation chamber in a coaxial relationship therewith and a second solenoid is disposed near the substrate. Processing includes generating a gas plasma by flowing a gas into the generation chamber, introducing microwave radiation into the chamber and controlling the first solenoid current to produce a magnetic field in the generation chamber. In particular, the value of a magnetic flux density at any point on a plane perpendicular to an axis of the first solenoid at a lengthwise midpoint is made to be higher than 1.01 times the value of the magnetic flux density satisfying the electron cyclotron resonance condition. And the value of the magnetic flux density at any point on a plane perpendicular to the axis of the first solenoid at an end is made to be lower than 0.99 times the value of the magnetic flux density satisfying the electron cycltoron resonance condition. Plasma is extracted from the generation chamber along lines of magnetic force produced by the first solenoid into the processing chamber and is directed onto a surface of the semiconductor substrate along lines of magnetic force of a cusp-shaped magnetic field produced by the second solenoid so that the plasma processes the surface of the semiconductor substrate.

7 Claims, 14 Drawing Sheets

EVACUATION SYSTEM

PLASMA PROCESSING APPARATUS

BACKGROUND OF THE INVENTION

1. Field of the Invention

The present invention relates to a microwave plasma processing apparatus used in the production of semiconductor devices for dry etching or forming a thin film by CVD (Chemical Vapor Deposition) by utilizing microwave plasma.

2. Description of the Prior Art

The microwave plasma processing apparatuses for processing the surface of a substrate by utilizing ECR (Electron Cyclotron Resonance) plasma has attracted much attention of the field of the semiconductor device manufacture. One of the most important features of ECR plasma processing resides in the fact that the electrons are accelerated by the resonance effect between the magnetic field and the microwaves so that the kinetic energy of the accelerated electrons ionizes a gas, thereby creating a high-density plasma. Each of the electrons excited by the microwaves makes a rotary motion about a line of magnetic force. In this case, the condition that the centrifugal force and Lorenz force are balanced is defined as the ECR condition. This condition is expressed by $$\omega/B = q/m$$

where the centrifugal force and the Lorenz force are expressed by $mr \cdot \omega^2$ and $-qr \cdot \omega B$, respectively, wherein, $\omega$: angular frequency of the microwave;

B: magnetic flux density; and q/m: specific charge of electron.

In general, the microwave frequency is 2.45 GHz which is industrially accepted. In this case, the resonance magnetic flux density is 875 gauss.

FIG. 1 illustrates a sectional view used to explain the construction of a conventional ECR plasma apparatus. The microwaves generated by a microwave generator (not shown) are introduced into a plasma generation chamber 3 through a waveguide 1. A gas such as $N_2$, $O_2$, Ar or the like for generating plasma is introduced through a gas supply pipe 4 into the plasma generation chamber 3. Disposed between the waveguide 1 and the plasma generation chamber 3 is a vacuum window 2 such as quartz in order to gas-tightly separate the waveguide 1 under atmospheric pressure and the plasma generation chamber 3 which is evacuated by an evacuation system (not shown). The plasma generation chamber 3 is cooled with water fed through a cooling system 5. Also disposed at the lower end of the plasma generation chamber 3 is a metal plate 7 with a large opening 7A. This plate 7 and the plasma generation chamber 3 define a half-opened microwave resonator. Excitation solenoid 6 surrounds the outer surface of the resonator in such a way that a magnetic field adapted to satisfy the ECR condition is generated, whereby plasma is produced within the resonator chamber. The plasma thus generated is forced into a processing chamber 9 along the lines of magnetic force and is directed toward a substrate stand 10. For example, monosilane gas ($SiH_4$) is introduced into the processing chamber 9 through a gas supply means including a valve 12A and a supply pipe 2 so that the introduced gas is activated by the plasma. Then, the activated species react with a substrate 11 which is a specimen to be processed, whereby a thin film is formed over the surface of the substrate.

When, an etching gas is supplied through the gas supply pipe 4 instead of $N_2$ or the like the apparatus can be used for etching the surface of a substrate.

Prior to the description of the problems resulting from the construction and the operation of the ECR plasma etching apparatus or the CVD apparatus of the type described above, how a plasma is generated will be described. In the case of the ECR plasma etching apparatus or the CVD apparatus, in order to carry out the efficient etching or growth of a thin film by increasing the plasma density, a magnetic field region which satisfies the ECR condition must be established within the plasma generation chamber. However, since the length of the axial direction of the excitation solenoid is limited, this magnetic field region is impossible to expand into the whole space of the plasma generation chamber as if the length of the solenoid in the axial direction were limitless. The above-mentioned magnetic field region exists within a limited space only and the shape and the position of the region in the axial direction of the plasma generation chamber are determined in response to the outer and inner diameters, the height, the number of turns of the solenoid and other design factors, and the magnitude of the current flowing through the excitation solenoid. Furthermore, the generation of the plasma is dependent upon the outer product of the strength of the electric field and the magnetic flux density (E×B), so that the position of the magnetic field region (termed the resonance magnetic field region hereinafter in this specification) relative to the microwave electric field strength distribution become very important factors influencing the speed of the substrate surface processing as well as the quality of the processed surface, for example, the growth rate of a thin film over the surface of a substrate and film qualities such as thickness distribution of the film grown and the density of film. The microwave electric field strength distribution within the plasma generation chamber is dependent upon the shape and size of the plasma generation chamber and the matching condition between the microwaves and the load. As an example of microwave electric field strength distribution when the plasma generation chamber is constructed as a resonator creating the resonance mode TE113. In this case, within the plasma generation chamber 3, there exist three crests of the standing microwave. The electric field strength in the axial direction of the plasma generation chamber is equal to the amplitude of the standing wave and which decreases in the radial direction of the chamber. It has been thought, therefore, that when the space in which the resonance magnetic field region is created is controlled by varying the magnitude of the current flowing through the solenoid, the ECR plasma generation efficiency as well as the distribution of the plasma density within the plasma generation chamber can be controlled. It has been, however, difficult in practice to form at a high growth rate a thin film which not only has excellent qualities but also has a uniform distribution of film thickness.

SUMMARY OF THE INVENTION

In view of the above, an object of the present invention is to provide a plasma processing apparatus which can generate a plasma at a high degree of efficiency and, therefore, can form a thin film with a high quality and having a uniform distribution of film thickness at a high growth rate.

Another object of the present invention is to provide a plasma processing apparatus which, in the case of etching of a specimen substrate, can improve not only the distribution of an etching rate within a thin film but also quality of etching results.

In the aspects of the present invention, a plasma processing apparatus comprises:

a microwave generation means;

microwave transmission means for transmitting the microwaves generated by the microwave generation means;

a plasma generation chamber which communicates with the microwave transmission means and having gas supply means and an opening defined at the end portion in opposing relationship with the microwave transmission means;

a first excitation solenoid disposed around the plasma generation chamber in a coaxial relationship therewith and for defining a magnetic field for generating plasma of a gas introduced into the plasma generation chamber by the resonant effect with microwaves;

a processing chamber communicating with the plasma generation chamber through the opening and for processing a surface of a substrate disposed therein with the plasma;

a second exciting solenoid disposed in opposing relationship with the first exciting solenoid and for producing a magnetic field whose polarity is opposite to that of the magnetic field produced by the first exciting solenoid in the vicinity of the surface of the substrate; and a power source for applying an RF power to the substrate.

Here, the first and second exciting solenoids may create a cusp magnetic field in the vicinity of the surface of the substrate.

The second exciting solenoid may be disposed on an opposite side of the first exciting solenoid with the substrate being interposed therebetween.

The second exciting solenoid may be so disposed as to surround the substrate.

The power source may cause the substrate to have a negative potential relative to the plasma.

The plasma may be generated by flowing through the first exciting solenoid a current within a range in which the plasma density decreases suddenly with the increase of the current and lower than an medium value of the range.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 3:
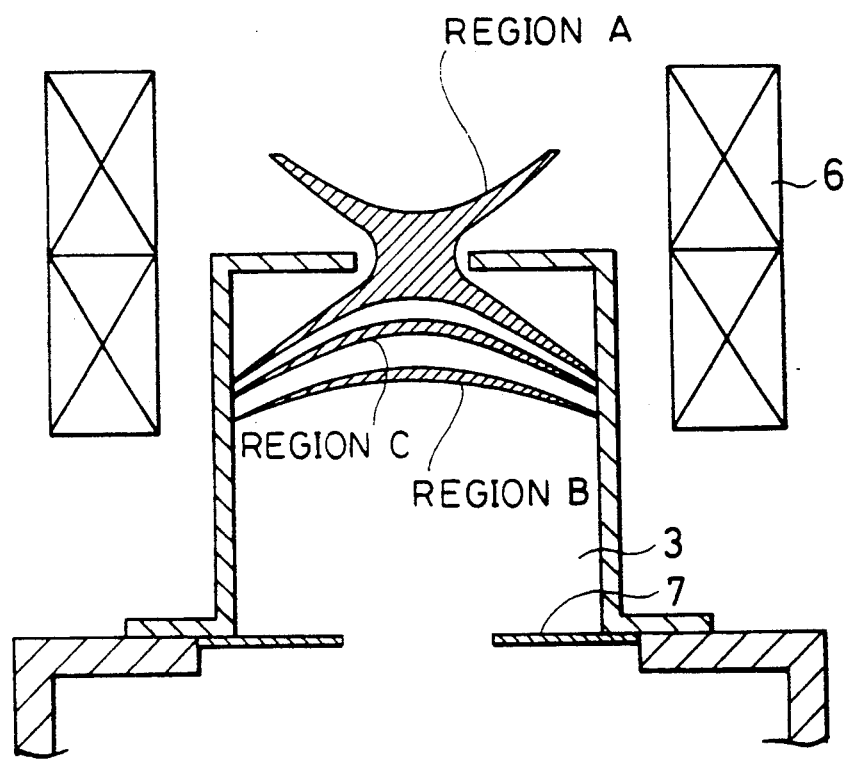
FIG. 3 is a diagram illustrating resonance magnetic field regions within a plasma generation chamber.
Figure 4:
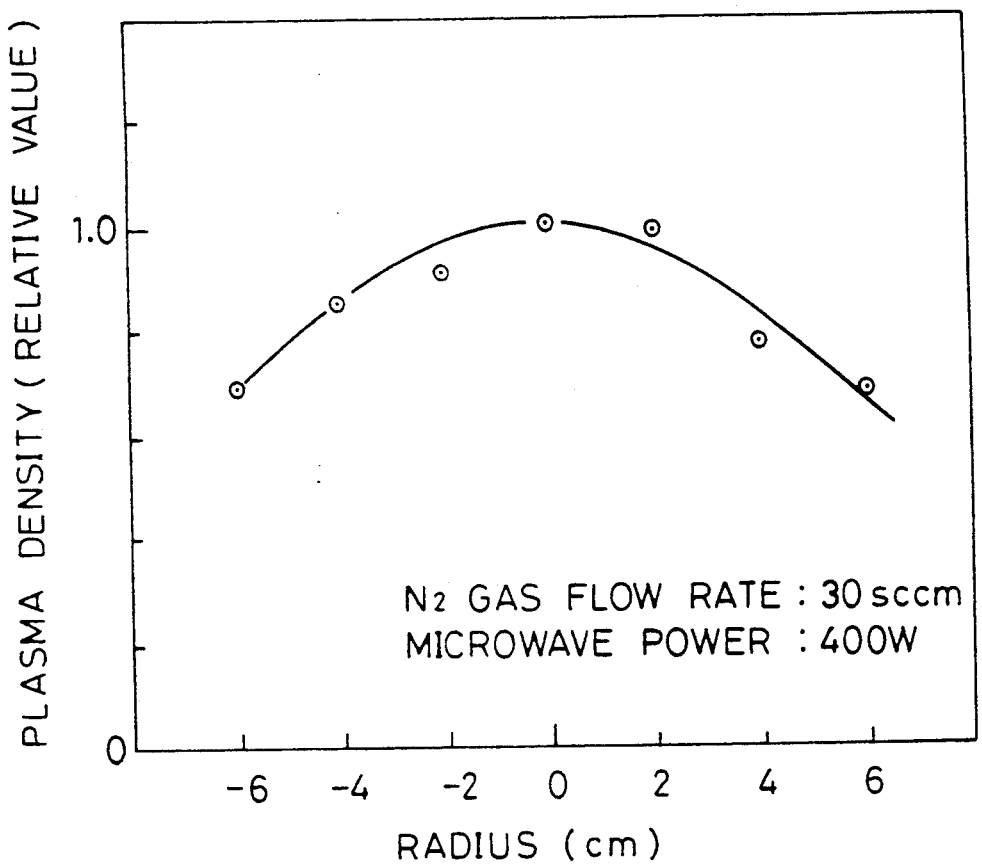
FIGS. 4 and 5 are diagrams illustrating the respective distributions as of the plasma density in the radial direction of the plasma generation chamber when the resonance magnetic field regions are created in the regions A and B as shown in FIG. 3.
Figure 5:
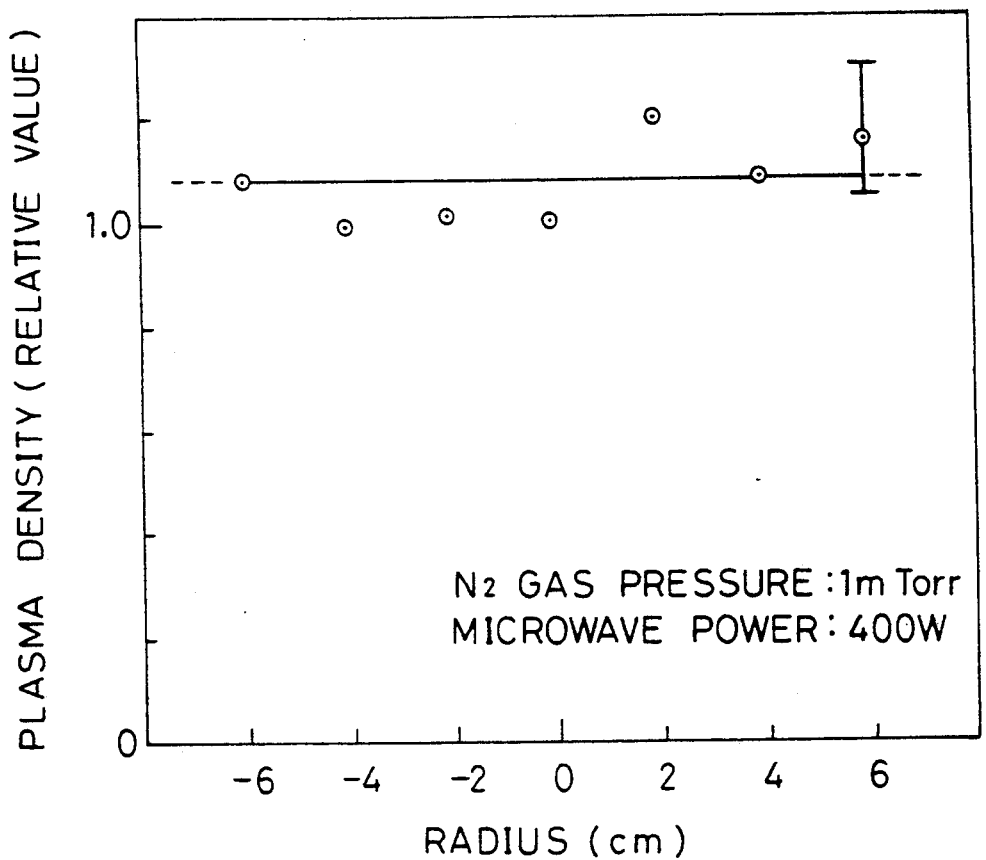

The inventors conducted extensive experiments and detailed analyses of the distribution of the magnetic flux density generated within the plasma generation chamber by flowing current through the excitation solenoid. The calculated results are shown in FIG. 3, the hatched regions show the resonance magnetic field regions in which the error of the magnetic flux with respect to the magnetic flux density 875 gauss resonant with the microwave with 2.45 GHz is within ±1%. These resonance magnetic field regions vary in response to the magnitude of the current flowing through the solenoid. When the current is made to flow through the solenoid in such a way that the ECR condition is satisfied in the vicinity of the center of the solenoid in the longitudinal direction, as shown as the region A, the resonance magnetic field region is thick in the axial direction of the solenoid in the vicinity of axis but the thickness is suddenly decreased in the radial direction, so that the plasma has a tendency to concentrate in the vicinity of the axis of the solenoid. On the other hand, when the current is made to flow through the solenoid in such a way that the resonance magnetic field region is created in the vicinity of the ends of the solenoid, as shown as the region B, the thickness of the resonance magnetic field region become thin in the vicinity of the axis of the solenoid, but the thickness is substantially uniform in the radial direction. The region C illustrates the resonance magnetic field region when the current flows through the solenoid in such a way that the resonance magnetic field region is defined between the end and the space in the vicinity of the center of the axis of the solenoid. In this specification, the mode of the plasma generation by the magnetic field defined with the region A is defined as mode I and the mode of the plasma generation by the magnetic field defined with the region B, mode II. When a plasma is created in mode I, the efficiency of plasma generation is high so that a plasma with a relatively high density can be obtained. In the case of the mode II, efficiency of the plasma generation becomes less than in mode I, but the distribution of the plasma density in the radial direction becomes uniform. FIGS. 4 and 5 illustrate the distribution of the density of the plasmas generated by modes I and II, respectively, in the radial direction of the plasma generation chamber under the conditions that the pressure of $N_2$ is 1 mTorr, the flow rate is 30 sccm and the power of the microwaves is 400 W. In mode I, a deviation of about 30% in the plasma density occurs in the radial direction, but in mode II, a deviation is within about 10%. In FIGS. 4 and 5, the plasma density is plotted as a relative value where the density at the axis is unit, but the absolute value is higher in the mode I than the mode II.

Figure 6A:
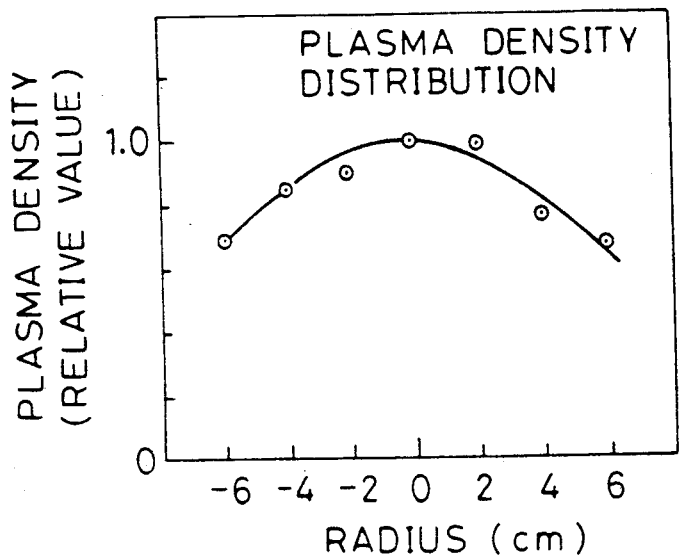
FIGS. 6A and 6B are diagrams illustrating the distribution of the plasma density and the thickness of the grown film, respectively, in the radial direction.
Figure 6B:
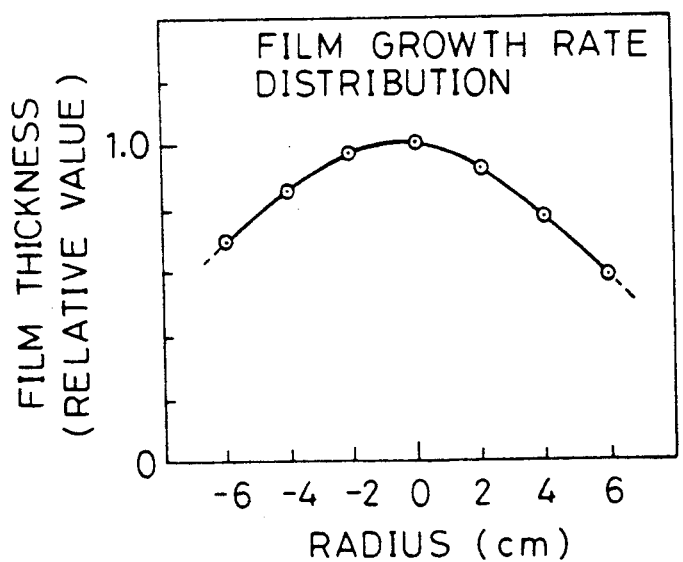

For example, the thin film grown over the surface of the substrate becomes more dense when the plasma density becomes greater, but when a plasma density becomes lesser, the film becomes coarse. Furthermore, the distribution of the thin film thickness is substantially similar to the plasma density distribution. FIGS. 6A and 6B illustrate the plasma density and film thickness, respectively, in the radial direction when, for example, the plasma of nitrogen is generated in accordance with mode I and an $Si_3N_4$ film is grown over the surface of the substrate by introducing silane ($SiH_4$) into the processing chamber. As seen from FIGS. 6A and 6B, the distribution of the plasma density and the distribution of the film growth rate, that is the distribution of the thickness of the grown film, are in a substantially corresponding relationship. It follows, therefore, when it is desired to improve the film qualities and the film growth rate, it is preferable to grow the film with mode I, while when it is desired to improve the distribution of the film thickness, it is preferable to grow the film with mode II.

Figure 7:
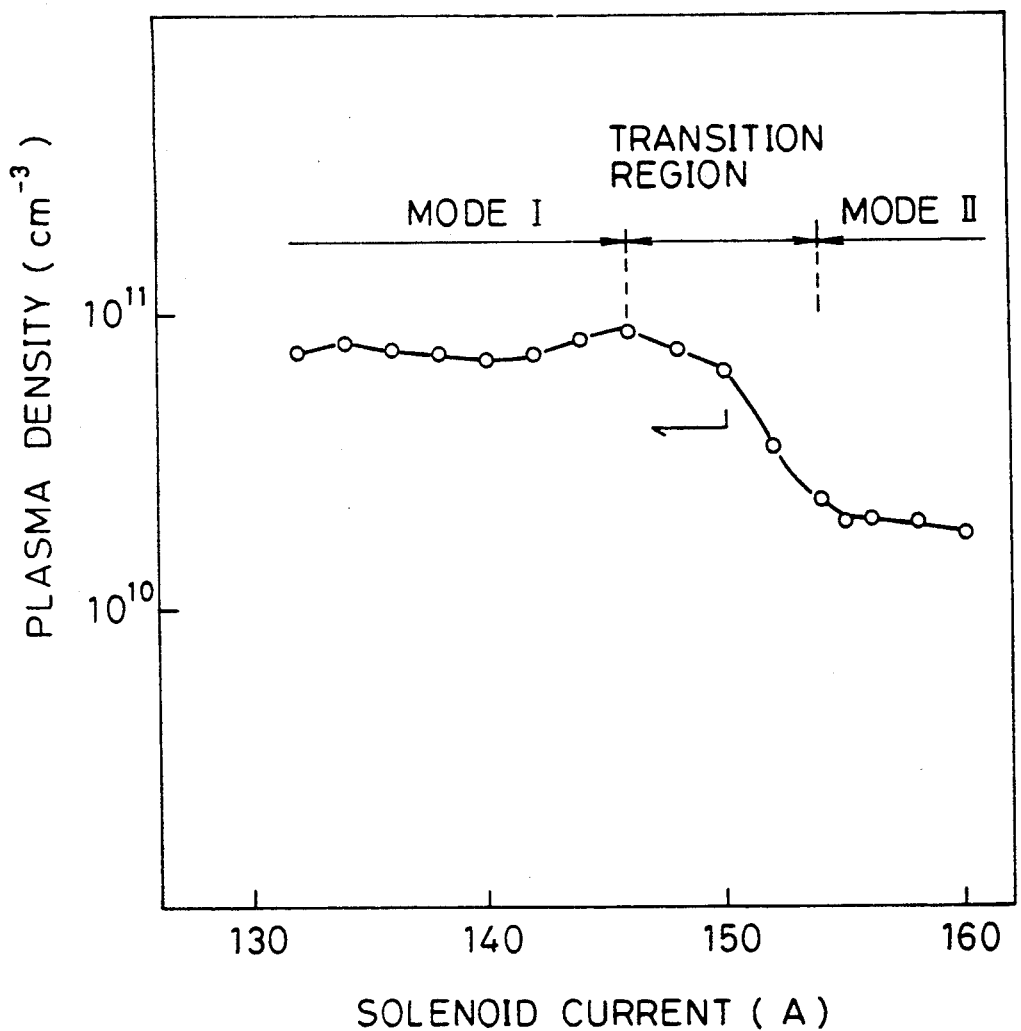
FIG. 7 is a diagram illustrating the dependence of the plasma density upon the excitation solenoid current.

FIG. 7 illustrates one example of the dependence of the density of the plasma generated in the plasma generation chamber upon the solenoid current. In this case, the plasma density is substantially uniform until the solenoid current rises to 146A. The range of such magnitude of the current corresponds to mode I of the plasma generation, in this mode the plasma is generated by the resonance magnetic field produced in the vicinity of the center in the axial direction of the excitation solenoid. When the solenoid current is increased, the plasma density drops suddenly. The decrease in such plasma density continues until the solenoid current rises to 154A and when the solenoid current is beyond 154A, the plasma density becomes substantially constant again. The range of the magnitude of the solenoid current in which the plasma density can be substantially maintained at a relatively low level corresponds mode II of the plasma generation, in this mode the plasma is generated by the resonance magnetic field produced in the vicinity of the end of the excitation solenoid. The plasma density in the resonance magnetic field regions in mode I is different from that in mode II by one digit. And there exists a transition region in which the plasma density varies in response to the magnitude of the solenoid current. The magnitudes of the solenoid current at the boundary between the transition region and mode I and between the transition region and mode II vary depending upon the shapes and sizes of the plasma generation chamber and of the excitation solenoid, but the three regions shown in FIG. 7 exist regardless of each dimension of the apparatus.

In the portion within the transition region adjacent o Mode I, the plasma density is substantiality as high at that in Mode I so that it is possible to obtain a plasma generation efficiency and the distribution of film thickness substantially equal to or better than those in the Mode I region. However, the distribution of the plasma density within the surface in the vicinity of the substrate is of the order of ±10% even in mode II and is by far lower in the plasma formed with Mode I. As a consequence, when a film is formed under the above-mentioned conditions by using a single solenoid, it becomes difficult to obtain a substantially satisfactory film thickness distribution.

Figure 1:
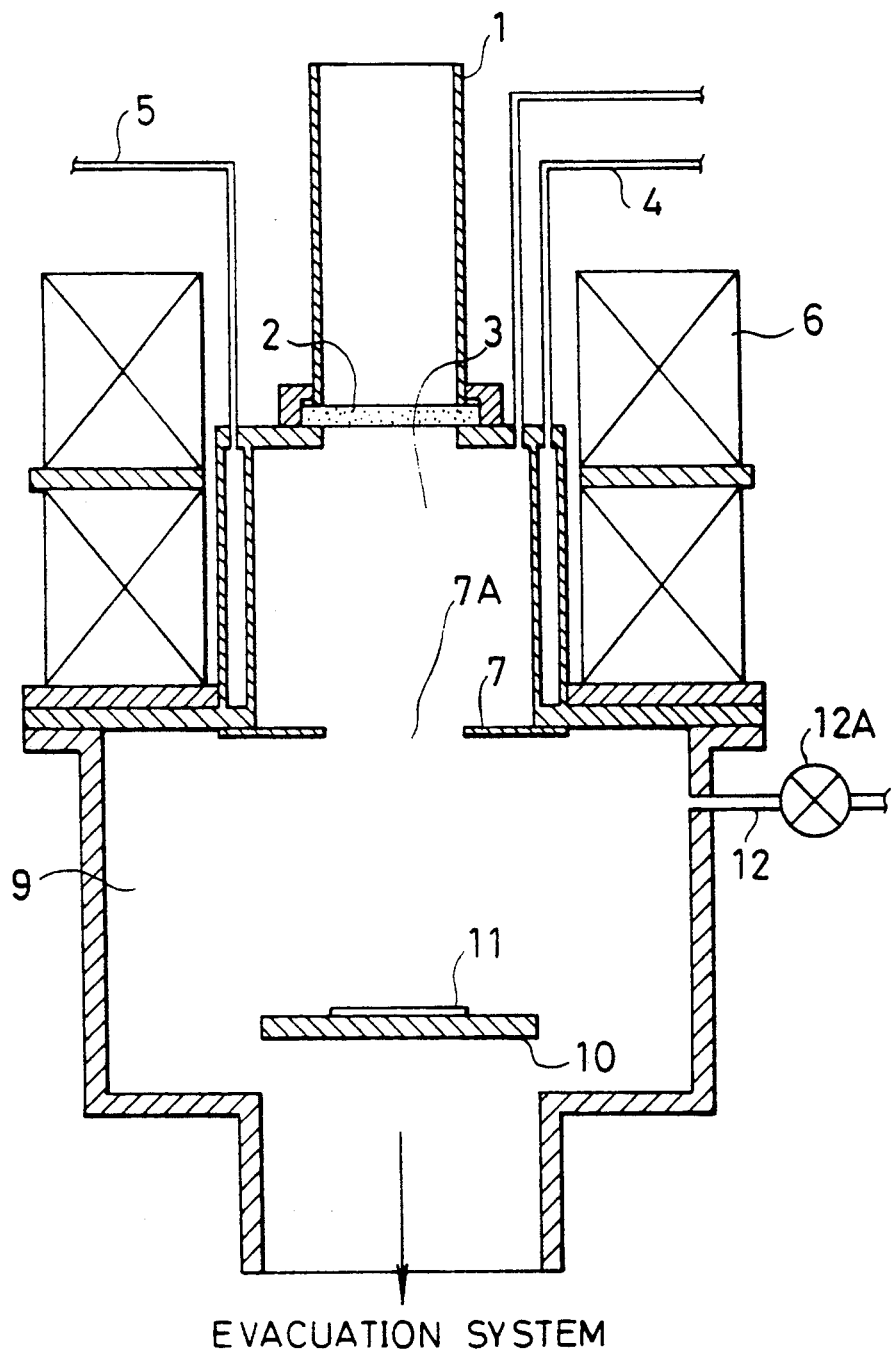
FIG. 1 is a schematic sectional view illustrating the construction of a conventional ECR plasma processing apparatus.
Figure 2:
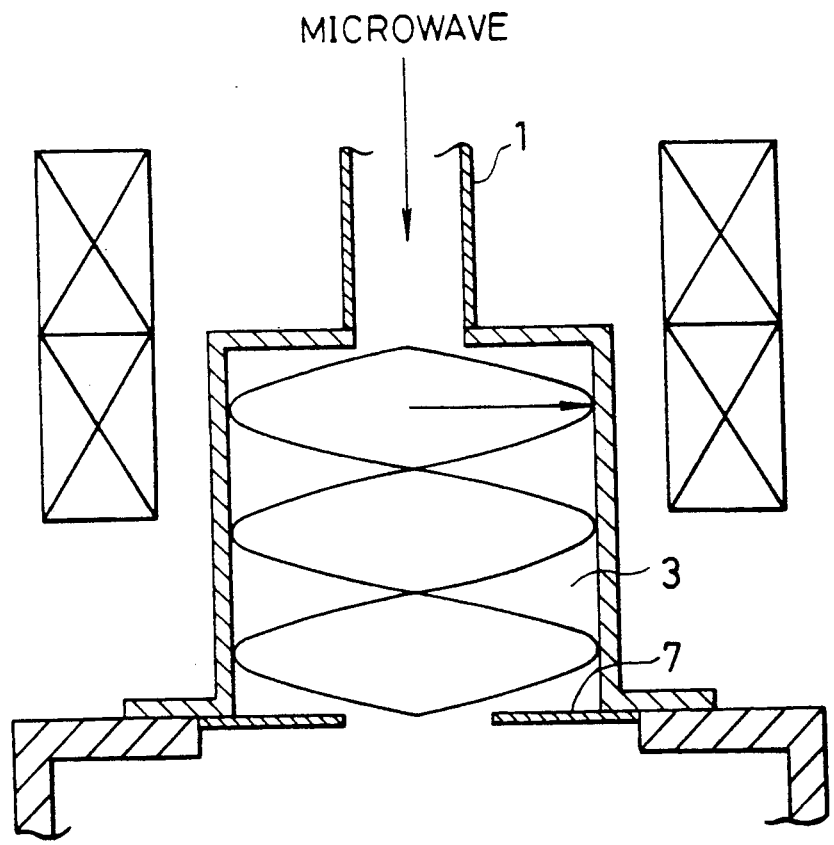
FIG. 2 is a sectional view for illustrating a standing waveform form showing the electric field strength within a resonator capable of exhibiting the resonant mode TE113.
Figure 8:
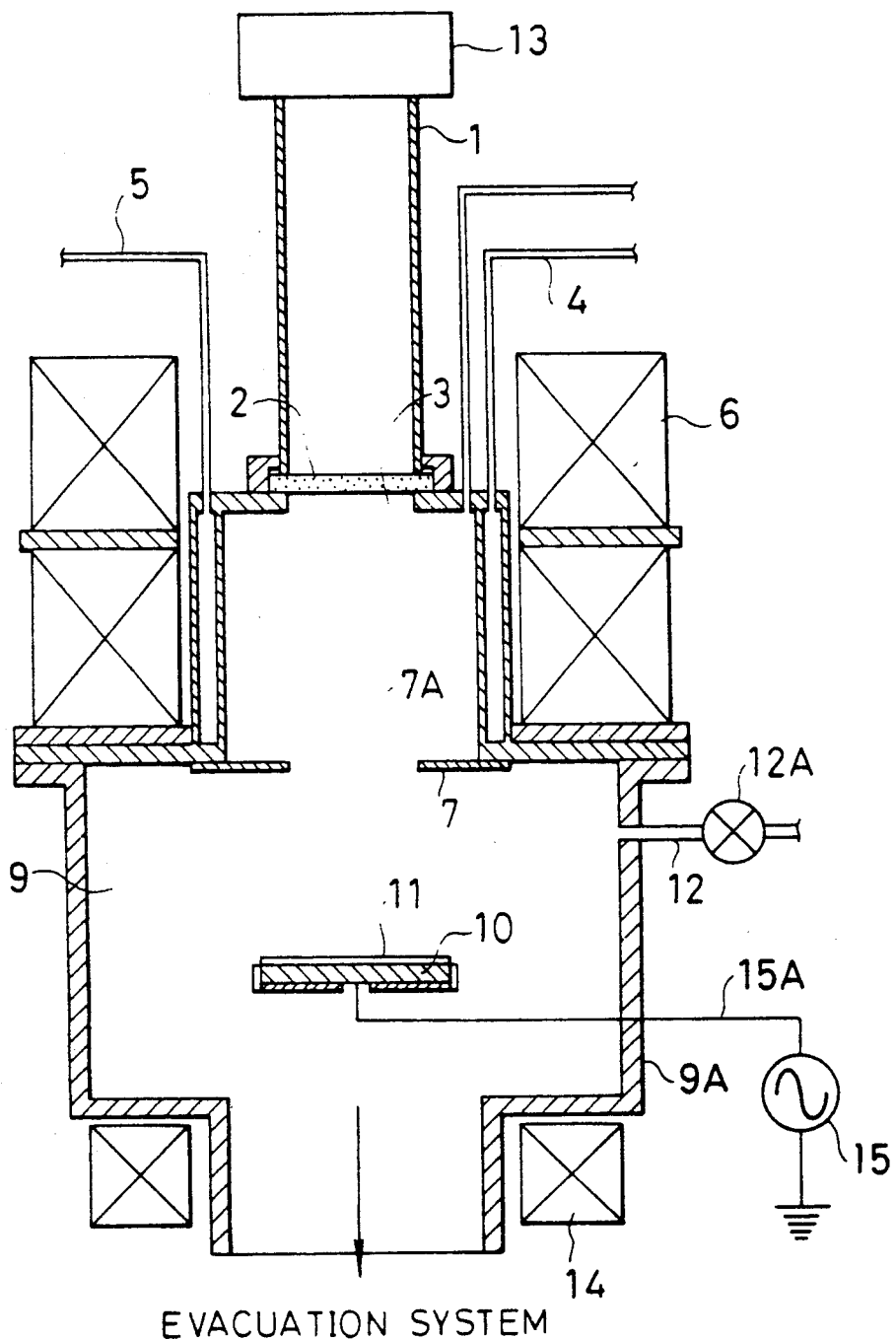
FIG. 8 is a schematic sectional view illustrating an embodiment of a plasma processing apparatus in accordance with the present invention.

FIG. 8 illustrates an embodiment of a plasma processing apparatus in accordance with the present invention. Same reference numerals are used to designate similar parts in both of FIGS. 1 and 8. The plasma generation chamber 3 and the processing chamber 9 are evacuated to a high vacuum through the exhaust port 9A of the processing chamber 9 by the evacuation system (not shown). Next, a predetermined gas such as Ar is introduced through the gas supply pipe 4 into the plasma generation chamber 3 in such a way that the pressure therein can be maintained at a predetermined level (for example, 1 to 10 mTorr). Next, the microwave energy is introduced into the plasma generation chamber 3 through the waveguide 1 and the vacuum window 2 from a microwave generating source 13 comprising a microwave oscillator, an isolator and a matching device and so on, and current is caused to flow through the excitation solenoid 6 surrounding the plasma generation chamber 3 so that the magnetic field which satisfies the ECR condition is created in the plasma generation chamber 3 which constitutes a resonator, thereby generating plasma.

A second exciting solenoid (a sub-solenoid) 14 is disposed in a coaxial relationship with the resonant magnetic field exciting solenoid 6 and on the rear side of the substrate 11. Electrically connected to the substrate 11 through a line 15A, which is electrically insulated from the wall 9A of the processing chamber 9, is an RF power source 15 whose frequency ranges from tens kHz to tens MHz (in this embodiment, the frequency of the RF power source 15 is 13.56 Mhz). In the case of the growth of a thin film such as a thin film of silicon nitride, $N_2$ is supplied from the gas supply pipe 4 and is efficiently ionized by the electric field generated by the microwaves introduced into the plasma generation chamber 3 and the resonant magnetic field created in the chamber 3 by the exciting solenoid 6 to become plasma. The plasma thus generated is directed to the processing chamber 9 along the lines of magnetic force created by the exciting solenoid 6. On the other hand silane gas is introduced into the processing chamber 9 and a current whose polarity contributes to create the magnetic field whose polarity is opposite to that of the lines of magnetic force created by the exciting solenoid 6, is supplied to the sub-solenoid 14, whereby a cusp magnetic field is created in the vicinity of the surface of the substrate 11 on the side of the plasma generation chamber. Since an RF power source 15 is connected to the substrate 11, the substrate has a negative floating potential relative to the plasma. The plasma which activates monosilane gas while travelling to the substrate tends to suddenly change its moving direction along the lines of magnetic force forming cusp magnetic field. However, ions cannot change their moving direction along the lines of magnetic force due to their large inertia, so they that travel to the substrate while spreading to the radial direction, and are accelerated by the negative potential of the substrate to reach the substrate. Thus, a dense silicon nitride film is formed over the surface of the substrate.

Figure 9:
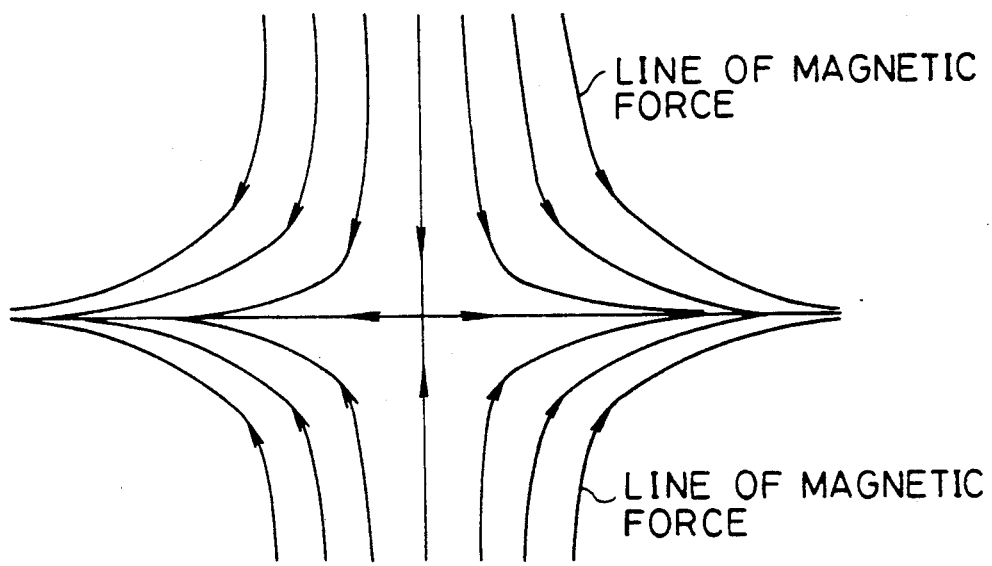
FIG. 9 is a view for explaining the distribution of lines of magnetic force defining a cusp magnetic field.

In more detail, the cusp magnetic filed is a magnetic field pattern produced in the space between the cylindrical solenoids which are disposed in coaxial relationship and furthermore through which are made to flow electric currents in such a manner that the solenoids create lines of magnetic force whose polarities are opposite. As shown in FIG. 9, in the cusp magnetic field, the nearer the line of magnetic force to the axis, the sharply it is bent. The electrons in the plasma generated in the plasma generation chamber are forcibly directed toward the processing chamber along the lines of magnetic force created by the exciting solenoid, but once they reach the cusp magnetic field, their directions are suddenly changed toward the peripheral wall of the processing chamber along the lines of magnetic force defining the cusp magnetic field. In this case, macroscopically the plasma tends to maintain a neutral charge so that not only the electrons but also the ions are directed into the processing chamber and the ions tend to suddenly change their moving directions in the cusp magnetic field as in the case of the electrons. The closer the ions approach the axis, the higher the degree of change in direction becomes. However, the inertial of an ion is by far greater than that of an electron. The ion cannot change its direction as suddenly as the electron due to the inertia of the ion, so that the ion reaches the substrate. It follows therefore when the current flowing in exciting solenoid 6 is adjusted to a value within the transition region as shown in FIG. 7 and near mode I, for example 150A, to create the resonant magnetic field region, which is in the vicinity of the axis and is thick in the direction thereof, the higher-density plasma in the vicinity of the axis spreads widely in the radial direction in the cusp magnetic field and the difference in the ion density between in the vicinity of center of the surface and in the vicinity of the peripheral portions becomes less. It is preferable that the magnitude of the current flowing through the first exciting solenoid is within the transition region and is smaller than its medium magnitude. The difference in the ion density between the center and the periphery on the surface of the substrate becomes less to that, as compared with the case in which the cusp magnetic field is not created, the distribution of the thickness of the thin film is remarkably improved.

Figure 10:
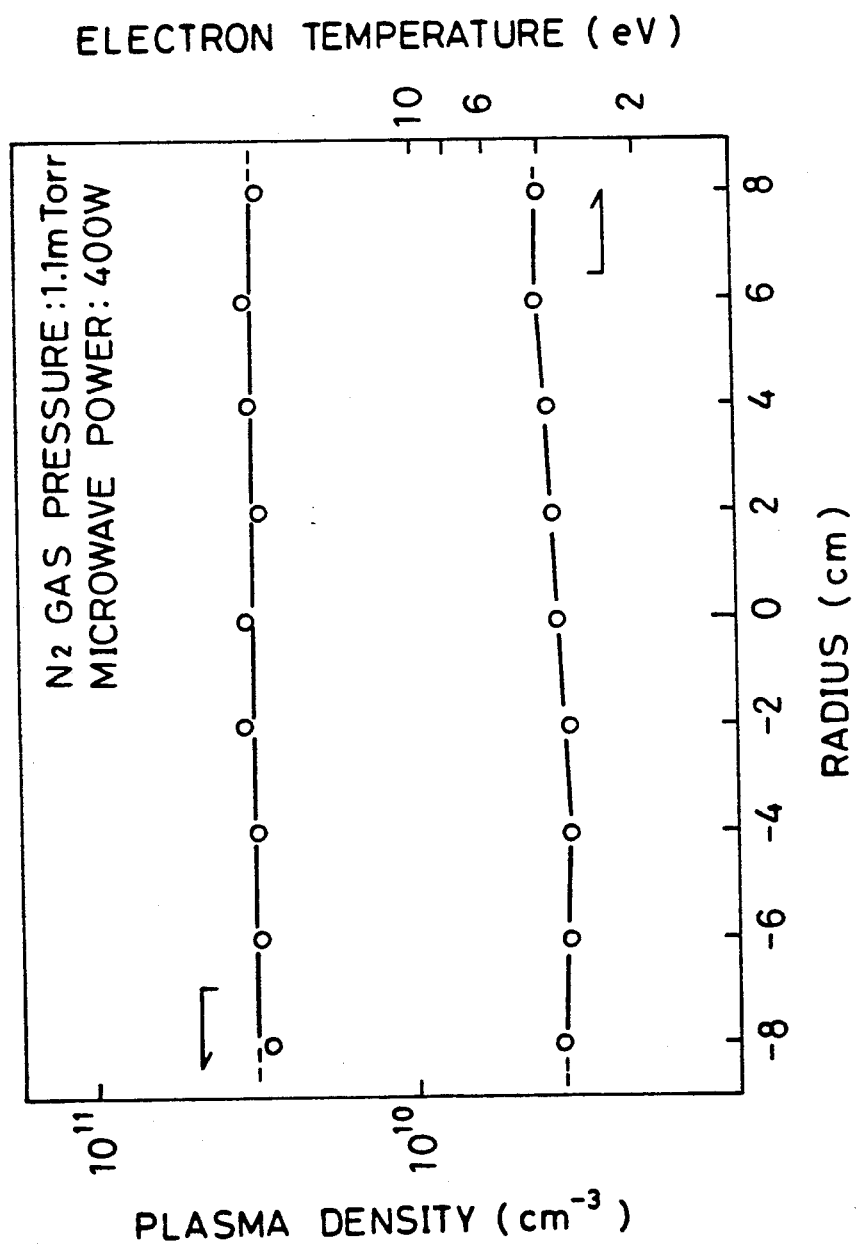
FIG. 10 is a diagram illustrating the influence of the cusp magnetic field upon the distribution of plasma density and the plasma temperature.
Figure 11:
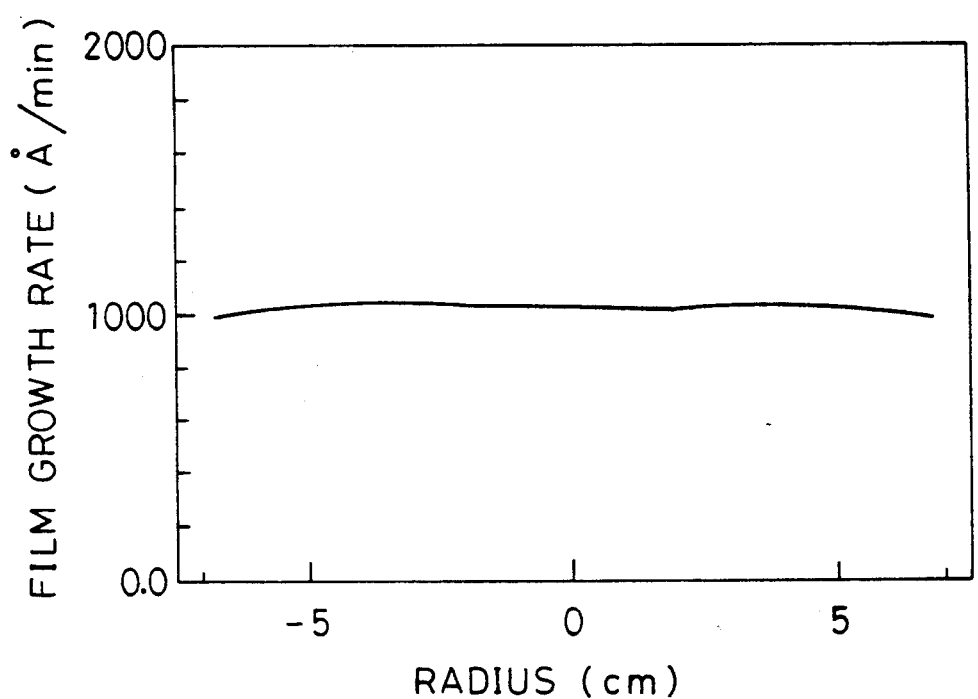
FIG. 11 is a diagram illustrating a film growth rate distribution within a film surface when a cusp magnetic field is used to form a thin film.

FIG. 10 illustrates the nitrogen plasma density distribution and the electron temperature distribution in the radial direction of the substrate under the influence of the cusp magnetic field. The conditions for generating plasma are such that the pressure of $N_2$ is 1.1 mTorr and the power of the microwaves is 400 W. The distributions of the plasma density and electron temperature are substantially uniform. It is very easy to maintain the non-uniformity in the plasma density within the order of $\pm 3-5\%$ by optimizing the conditions (the magnitude of the current flowing through each exciting solenoid, the position of the second exciting solenoid and so on) for creating the cusp magnetic field. As a result, the non-uniformity in the case of the film growth rate or etching rate could be maintained within the order of 5% of the tolerance normally required. For instance, FIG. 11 illustrates the distribution of the growth rate within the surface of the silicon nitride film formed over the surface of a silicon substrate of 6 inches in diameter under the above-mentioned conditions. FIG. 11 shows that the non-uniformity of distribution of the growth rate is maintained within $\pm 3-4\%$ and that the creation of the cusp magnetic field is extremely effective to maintain the distribution of the surface processing rate.

Figure 12:
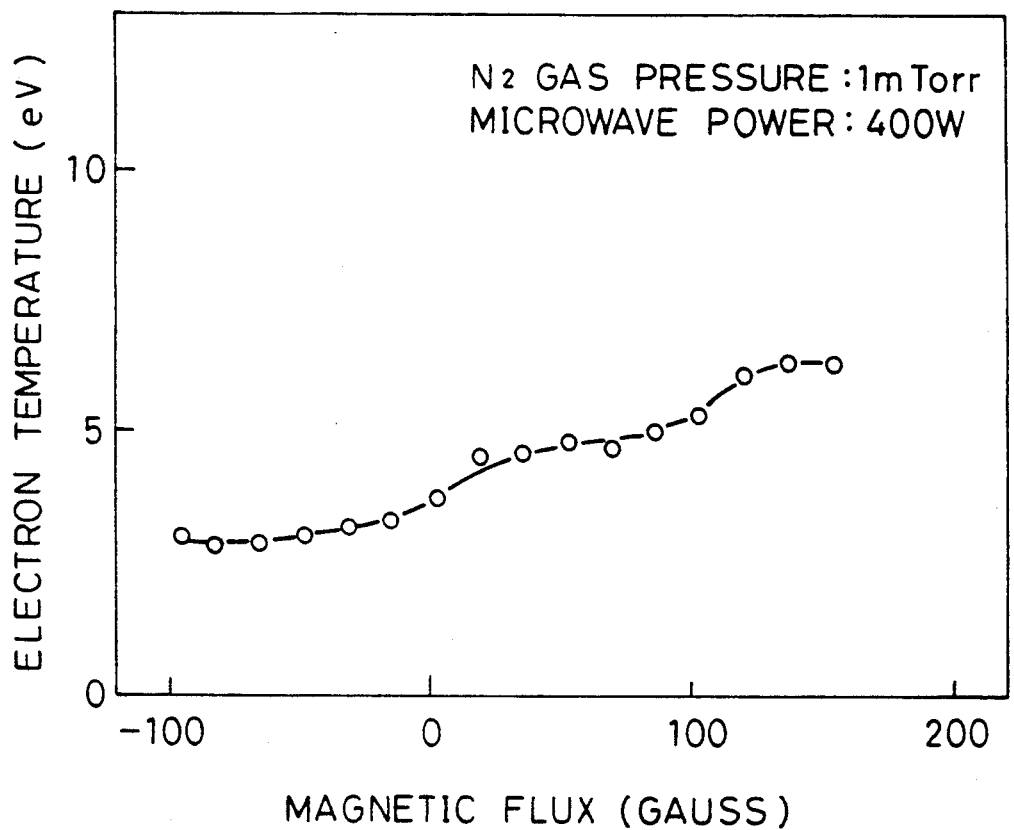
FIG. 12 is a diagram illustrating the dependence of the electron temperature upon the magnetic flux in the axial direction of a substrate subjected to a cusp magnetic field.
Figure 13:
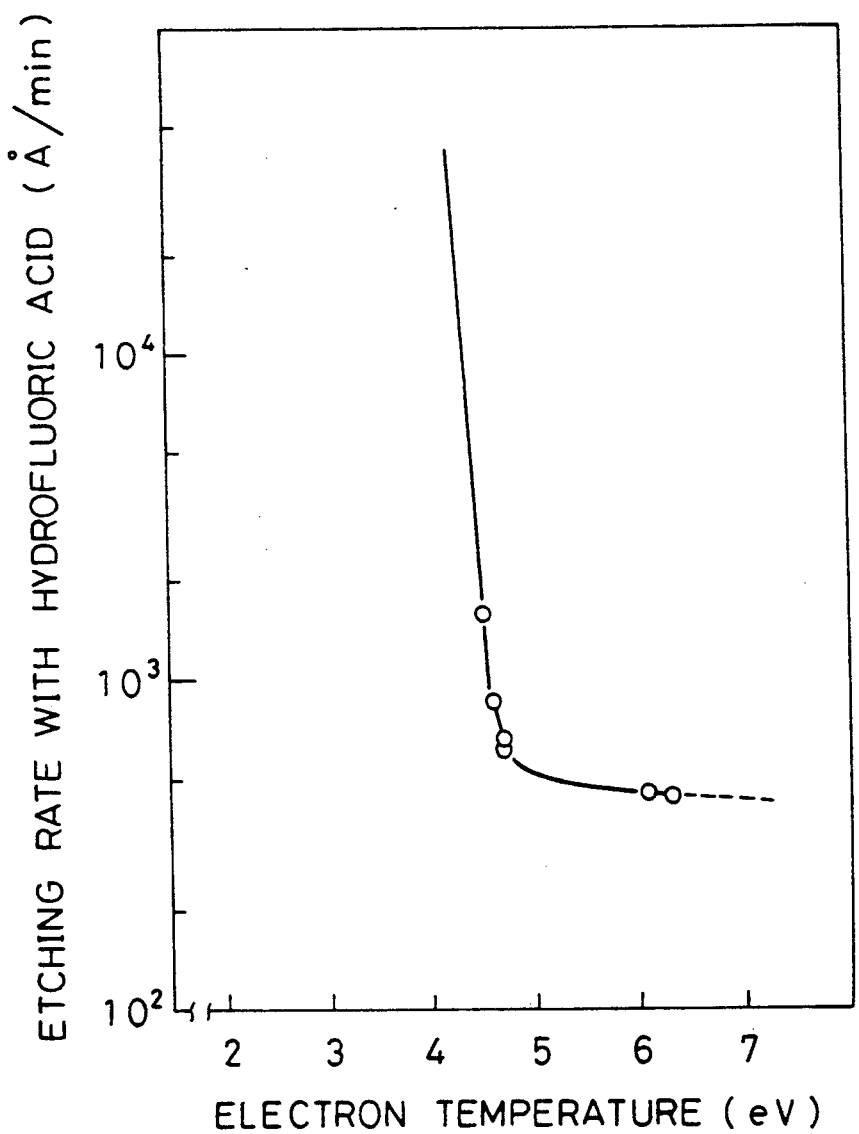
FIG. 13 is a diagram illustrating the relationship between the etching rate of a grown silicon nitride film with hydrogen fluoride and the electron temperature of plasma at the front surface of a substrate.

However, when the cusp magnetic field is created on the side of the font surface of a substrate, plasma spreads so that the distribution within the surface is improved, but the electron temperature of the plasma varies. As compared with the case in which no cusp magnetic field is created, the electron temperature drops. FIG. 12 illustrates the dependence of the electron temperature on the cusp magnetic field. In other words, FIG. 12 illustrates the relationship between the magnetic flus density component in the direction of the axis of the solenoid over the surface of the substrate and the electron temperature when the magnitude of current flowing through the sub-solenoid was varied under the condition that the plasma was generated under the conditions that the pressure of $N_2$ was 1 mTorr and the microwave power was 400 W. The magnetic flux density shown in FIG. 12 shows the value at the center position of the substrate. The negative magnitude of the magnetic flux density shows that the magnetic field created by the sub-solenoid over the surface of the substrate is superior to that produced by the exciting solenoid for creating the resonant magnetic field region. The positive value shows that the magnetic field created by the exciting solenoid for creating the resonant magnetic field. Since the electron temperature is in proportion to the floating electric potential over the surface of the substrate, so that when the electron temperature drops, the floating potential also drops. As a result, the quality of a grown film varies when the film is grown. As an example of the above-mentioned phenomena. FIG. 13 illustrates the dependence of the etching rate of a film of silicon nitride with hydrofluoric acid on the electron temperature. As is quite apparent from FIG. 13, when the electron temperature drops as lower as about 4.7 eV, the density of the film is degraded and the etching rate becomes faster. The potential over the surface of the substrate corresponding to the electron temperature 4.7 eV corresponds to $-20 \sim -25$ V relative to the plasma potential. In other words, in the case of the growth of a silicon nitride film, a desired density cannot be obtained unless the ions are accelerated by the order of $-20 \sim -25$ V and it is understood that when the potential over the surface of the substrate drops below this value due to the electron temperature which in turn drops due to the cusp magnetic field, a desired density of a thin film cannot be obtained.

According to the present invention, however, it is possible to maintain the potential over the surface of the substrate from $-20 \sim -25$ V by controlling the floating potential by applying an RF bias to the substrate so that it becomes possible to control the thin film quality. Due to the application of an RF bias and the creation of a cusp magnetic field, a thin film whose quality is superior to that of a film formed by the plasma generated in mode I and whose thickness distribution is more uniform than that of a thin film grown by the plasma generated in mode II could be formed at a growth rate higher than that when a thin film is formed by the plasma in mode I.

Figure 14:
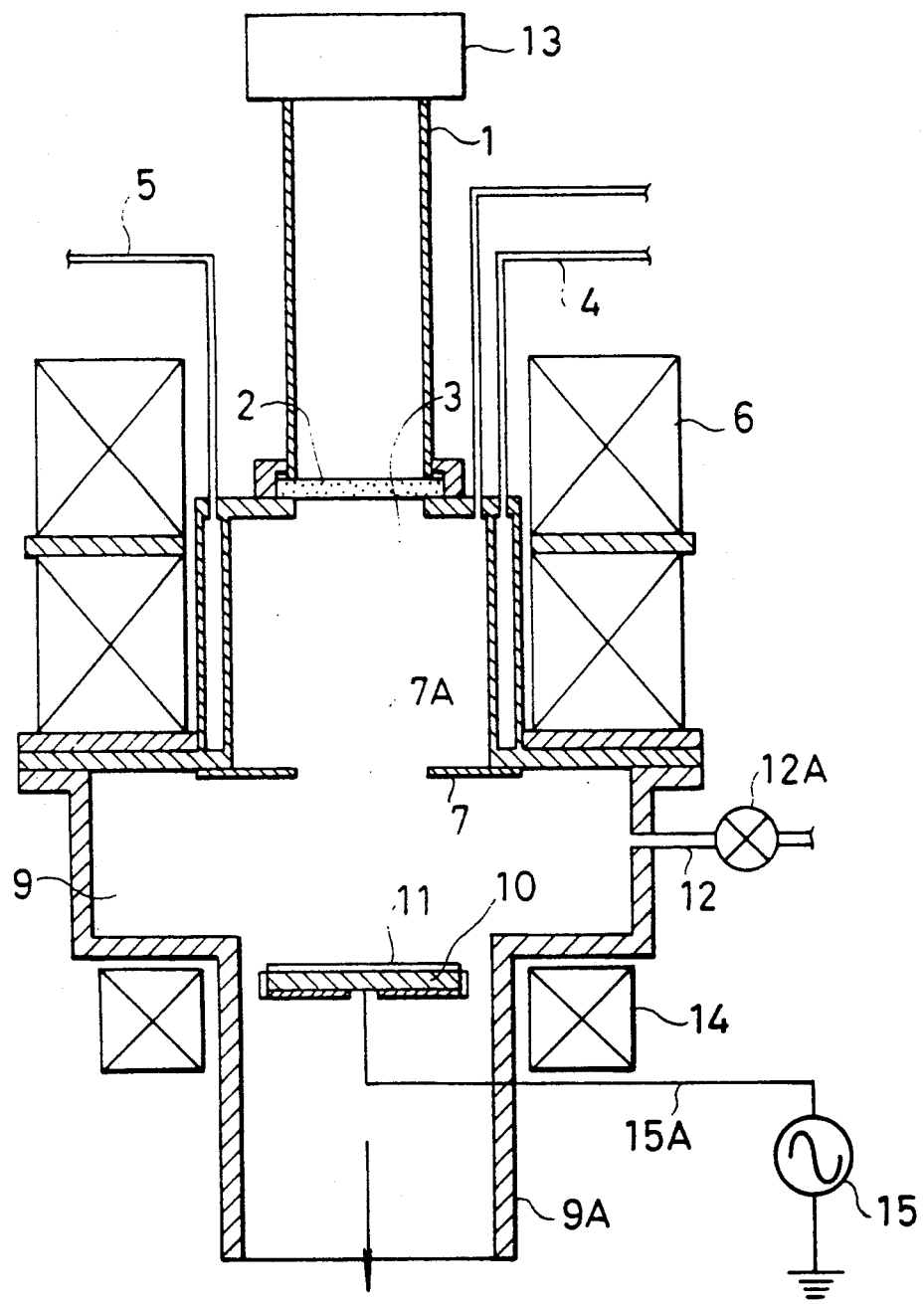
FIG. 14 is a schematic sectional view of another embodiment of a plasma processing apparatus in accordance with the present invention.

FIG. 14 illustrates another embodiment of a plasma processing apparatus in accordance with the present invention. The second exciting solenoid 14 is disposed so as to surround the substrate 11. The sub-solenoid 14 creates the magnetic field whose polarity is opposite to that of the magnetic field produced by the exciting solenoid 6 and forms the cusp magnetic field in the vicinity of the surface of the substrate 11. The effects attained by the above-mentioned embodiment are substantially similar to those attained by the embodiment described in detail with reference to FIG. 8.

So far, the surface processing in accordance with the present invention has been described only int eh case of growth of a thin film, but it is apparent to those skilled in the art that it is possible to carry out surface processing which can improve not only the etching rate distribution in the surface but also the effect of eliminating the damages of the surface being etched.

As described above, according to the present invention, it becomes possible to maintain a high surface processing rate while simultaneously improving not only the processing rate distribution over the surface of the substrate but also the quality of the surface processes.

The invention has been described in detail with respect to preferred embodiments, and it will now be apparent from the foregoing to those skilled in the art that changes and modifications may be made without departing from the intention in its broader aspects, and it is the invention, therefore, in the appended claims to cover all such changes and modifications as fall within the true spirit of the invention.

What is claimed is:

1. In a plasma processing apparatus for processing a semiconductor substrate, the apparatus having a plasma generation chamber communicating with a processing chamber for holding the substrate, a first excitation solenoid being disposed around the plasma generation chamber in a coaxial relationship therewith, a second excitation solenoid disposed in the vicinity of the semiconductor substrate, a method for plasma processing the semiconductor substrate comprising:

generating a gas plasma by flowing a gas into the plasma generation chamber, introducing microwave radiation into the plasma generation chamber and controlling a current flowing through the first excitation solenoid thereby defining a magnetic field and generating the gas plasma by a resonant effect with the microwave radiation, wherein the current is maintained within a current range in which plasma density decreases suddenly with an increase in the current; and extracting the gas plasma from the plasma generation chamber along lines of magnetic force produced by the first excitation solenoid into the processing chamber and directing the plasma onto a surface of the semiconductor substrate disposed in the processing chamber along lines of magnetic force of a cusp-shaped magnetic field produced by the second excitation solenoid so that the plasma processes the surface of the semiconductor substrate.

2. A method as claimed in claim 1, wherein the current is maintained at a value lower than a medium value of the current range.

3. A method as claimed in claim 1, wherein plasma density corresponding to an upper limit of the current range is approximately one tenth of plasma density corresponding to a lower limit of the current range.

4. A method as claimed in claim 1, wherein a second gas including an element to be deposited onto the surface of the semiconductor substrate is introduced into the processing chamber..

5. In a plasma processing apparatus for processing a semiconductor substrate, the apparatus having a plasma generation chamber communicating with a processing chamber for holding the substrate, a first excitation solenoid being disposed around the plasma generation chamber in a coaxial relationship therewith, a method for plasma processing the semiconductor substrate comprising:

generating a gas plasma by flowing a gas into the plasma generation chamber, introducing microwave radiation into the plasma generation chamber and flowing a current through the first excitation solenoid for defining a magnetic field thereby generating the gas plasma by a resonant effect with the microwave radiation;

varying the current flowing through the first excitation solenoid to find a current range within which plasma density suddenly decreases with an increase in the current; and extruding plasma from the plasma generation chamber and directing the plasma onto a surface of the semiconductor substrate held in the processing chamber while maintaining the current within the current range so that the plasma processes the surface of the semiconductor substrate.

6. A method as claimed in claim 5, wherein a second excitation solenoid is disposed in the vicinity of the semiconductor substrate and a current is passed through the second excitation solenoid to produce a magnetic field with a polarity opposite to that of the magnetic field produced by the first excitation solenoid.

7. A method as claimed in claim 6, wherein the second excitation solenoid is disposed so as to surround the semiconductor substrate.

* * * * *

UNITED STATES PATENT AND TRADEMARK OFFICE
CERTIFICATE OF CORRECTION

PATENT NO.  : 5,181,986
DATED       : January 26th, 1993
INVENTOR(S) : Kiyoshi OHIWA It is certified that error appears in the above-identified patent and that said Letters Patent is hereby corrected as shown below:

On the Title Page:

Please correct line [22] as follows:
--　　[22]　Filed:　　Mar. 29, 1991　　　　　--

Signed and Sealed this

Twenty-sixth Day of October, 1993

Attest:

BRUCE LEHMAN

Attesting Officer　　　　Commissioner of Patents and Trademarks